United States Patent
Yamazaki

(10) Patent No.: US 7,075,846 B2
(45) Date of Patent: Jul. 11, 2006

(54) APPARATUS FOR INTERLEAVE AND METHOD THEREOF

(75) Inventor: Masato Yamazaki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 129 days.

(21) Appl. No.: 10/861,485

(22) Filed: Jun. 7, 2004

(65) Prior Publication Data

US 2005/0099881 A1 May 12, 2005

(30) Foreign Application Priority Data

Nov. 6, 2003 (JP) ............................. 2003-377041

(51) Int. Cl.
*G11C 7/00* (2006.01)

(52) U.S. Cl. ....................... 365/221; 365/220; 365/219

(58) Field of Classification Search ................ 365/221, 365/220, 219, 239, 240
See application file for complete search history.

(56) References Cited

U.S. PATENT DOCUMENTS

| 6,038,185 | A | * | 3/2000 | Ng et al. | ..................... 365/221 |
| 6,067,267 | A | * | 5/2000 | Lo | .............................. 365/221 |
| 6,411,128 | B1 | * | 6/2002 | Maeda | ........................ 326/125 |
| 6,438,054 | B1 | * | 8/2002 | Kanazashi | .................. 365/219 |

FOREIGN PATENT DOCUMENTS

JP       2001-230680       8/2001

* cited by examiner

*Primary Examiner*—Anh Phung
(74) *Attorney, Agent, or Firm*—Nixon Peabody LLP; Donald R. Studebaker

(57) ABSTRACT

An apparatus for interleave includes a serial-parallel circuit which transforms a data form of an input data from serial into parallel and which outputs a plurality of parallel data, a first switch circuit which arranges order of the parallel data based on a first control signal and which outputs a plurality of first arranged data, a memory circuit which stores the first arranged data based on the first control signal and which outputs the stored first arranged data based on a second control signal, a second switch circuit which arranges order of the stored first arranged data based on the second control signal and which outputs a plurality of second arranged data, and a parallel-serial circuit which transforms a data form of the second arranged data from parallel into serial and which outputs a serial output data.

14 Claims, 11 Drawing Sheets

|  |  | Block A | | | Block B | | |
| --- | --- | --- | --- | --- | --- | --- |
|  |  | A | B | C | D | E | F |
| 901 | 0 (g1) | d1 | d5 | d9 | d49 | d53 | d57 |
|  | 1 (g2) | d16 | d20 | d24 | d64 | d68 | d72 |
|  | 2 (g3) | d27 | d31 | d35 | d75 | d79 | d83 |
|  | 4 (g4) | d38 | d42 | d46 | d86 | d90 | d94 |
| 902 | 0 (g1) | d2 | d6 | d10 | d50 | d54 | d58 |
|  | 1 (g2) | d13 | d17 | d21 | d61 | d65 | d69 |
|  | 2 (g3) | d28 | d32 | d36 | d76 | d80 | d84 |
|  | 4 (g4) | d39 | d43 | d47 | d87 | d91 | d95 |
| 903 | 0 (g1) | d3 | d7 | d11 | d51 | d55 | d59 |
|  | 1 (g2) | d14 | d18 | d22 | d62 | d66 | d70 |
|  | 2 (g3) | d25 | d29 | d33 | d73 | d77 | d81 |
|  | 4 (g4) | d40 | d44 | d48 | d88 | d92 | d96 |
| 904 | 0 (g1) | d4 | d8 | d12 | d52 | d56 | d60 |
|  | 1 (g2) | d15 | d19 | d23 | d63 | d67 | d71 |
|  | 2 (g3) | d26 | d30 | d34 | d74 | d78 | d82 |
|  | 4 (g4) | d37 | d41 | d45 | d85 | d89 | d93 |

Fig. 10

| d1 | d2 | d3 | d4 | d5 | d6 | d7 | d8 | d9 | d10 | d11 | d12 |
|---|---|---|---|---|---|---|---|---|---|---|---|
| d13 | d14 | d15 | d16 | d17 | d18 | d19 | d20 | d21 | d22 | d23 | d24 |
| d25 | d26 | d27 | d28 | d29 | d30 | d31 | d32 | d33 | d34 | d35 | d36 |
| d37 | d38 | d39 | d40 | d41 | d42 | d43 | d44 | d45 | d46 | d47 | d48 |
| d49 | d50 | d51 | d52 | d53 | d54 | d55 | d56 | d57 | d58 | d59 | d60 |
| d61 | d62 | d63 | d64 | d65 | d66 | d67 | d68 | d69 | d70 | d71 | d72 |
| d73 | d74 | d75 | d76 | d77 | d78 | d79 | d80 | d81 | d82 | d83 | d84 |
| d85 | d86 | d87 | d88 | d89 | d90 | d91 | d92 | d93 | d94 | d95 | d96 |

Fig. 11

APPARATUS FOR INTERLEAVE AND METHOD THEREOF

BACKGROUND OF THE INVENTION

1. Field of the Invention

The present invention relates in general to a wireless communication system, and more particularly, to an apparatus for interleave and a method for interleaving data.

This claims priority Japanese patent application, Serial Number 377041/2003, filed on Nov. 6, 2003, the subject matter of which is incorporated herein by reference.

2. Description of the Related Art

A conventional apparatus for interleave is described in FIG. 1 in Japanese laid-open patent number 2001-230680. The conventional apparatus for interleave comprises two interleavers. Each interleaver comprises a writing address controller, a read out address controller and a memory.

However, in the conventional apparatus for interleave, it takes a lot of cycle time to write data into the memory and read out a stored data from the memory. In addition, the conventional apparatus for interleave is no longer adaptable up to a two-input apparatus for interleave. Even through the conventional apparatus for interleave is adaptable to 8-bit input data, the conventional apparatus for interleave can not treat more than 16-bit at a time. The conventional apparatus for interleave can't sufficiently respond to a data amount used in a current bus access in CPU, for example, 32-bit and 64-bit.

SUMMARY OF THE INVENTION

A first aspect of the present invention, there is provided an apparatus for interleave which includes a serial-parallel circuit which transforms a data form of an input data from serial into parallel and which outputs a plurality of parallel data, a first switch circuit which arranges order of the parallel data based on a first control signal and which outputs a plurality of first arranged data, a memory circuit which stores the first arranged data based on the first control signal and which outputs the stored first arranged data based on a second control signal, a second switch circuit which arranges order of the stored first arranged data based on the second control signal and which outputs a plurality of second arranged data, and a parallel-serial circuit which transforms a data form of the second arranged data from parallel into serial and which outputs a serial output data.

A second aspect of the invention, there is provided a method of interleaving a data which comprises transforming data format of an input data d(i) where i is a positive integer from serial into parallel to output a plurality of parallel data by K units where K is a positive integer less than i, permuting the parallel data by K units in response to a first information, permuting the permuted parallel data by K units in response to a second information, transforming data format of the permuted parallel data from parallel into serial, and outputting the transformed serial data.

BRIEF DESCRIPTION OF THE DRAWINGS

FIG. 10 illustrates a data flow of the apparatus for interleave according to the fifth preferred embodiment of the present invention.

FIG. 11 illustrates a data flow of the apparatus for interleave according to the fifth preferred embodiment of the present invention.

DETAILED DESCRIPTION OF THE PREFERRED EMBODIMENTS

Figure 1:
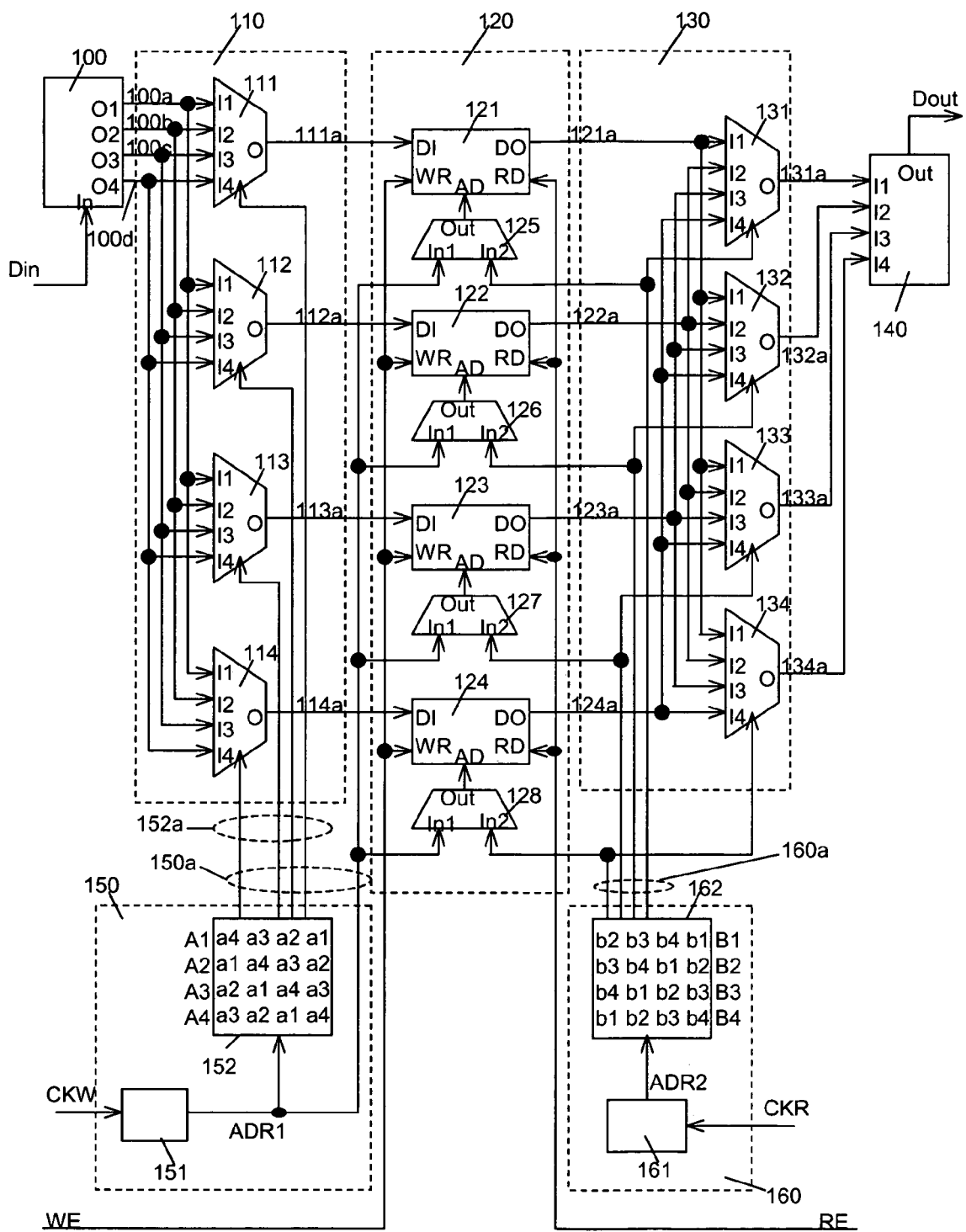
FIG. 1 is a block diagram of an apparatus for interleave according to a first preferred embodiment of the present invention.

FIG. 1 is a block diagram of an apparatus for interleave according to a first preferred embodiment of the present invention. The apparatus for interleave according to the first preferred embodiment of the present invention comprises a serial-parallel circuit 100, a first switch circuit 110, a memory circuit 120, a second switch circuit 130, a parallel-serial circuit 140, a first control circuit 150 and a second control circuit 160.

The serial-parallel circuit 100 couples to the first switch circuit 110. The serial-parallel circuit 100 has an input terminal In and N output terminals where N is a positive integer. The output terminals couple to the first switch circuit 110. In this embodiment, the serial-parallel circuit 100 has four (N=4) output terminals O1–O4. The serial-parallel circuit 100 inputs an input data Din whose data form is a serial through the input terminal In. The serial-parallel circuit 100 transforms a data form of the input data Din from serial into parallel and outputs a plurality of parallel data 100a–100d through the output terminals O1–O4 by N units. This preferred embodiment treats a data length as a bit unit, but it goes without saying that the preferred embodiment is able to treat the data length as a byte unit or a word unit.

The first switch circuit 110 couples to the serial-parallel circuit 100, the memory circuit 120 and the first control circuit 150. The first switch circuit 110 arranges order of the parallel data in response to a first control signal (first selection signal) output from the first control circuit 150 and outputs a plurality of first arranged data. The first switch circuit 110 comprises N selectors where N is a positive integer. Each selector has N input terminals and an output terminal OUT. In this embodiment, the first switch circuit 110 has four (N=4) selectors 111–114 and each selector has four (N=4) input terminals I1–I4. All input terminals I1 of all selectors 111–114 couple to the output terminal O1 of the serial-parallel circuit 100. Similarly, all input terminals I2 of all selectors 111–114 couple to the output terminal O2. All input terminals I3 of all selectors 111–114 couple to the output terminal O3. All input terminals I4 of all selectors 111–114 couple to the output terminal O4. All output terminals OUT of all selectors 111–114 couple to the memory circuit 120. The first arranged data 111a is output from the output terminal OUT of the selector 111. Similarly, the first arranged data 112a is output from the output terminal OUT of the selector 112. The first arranged data 113a is output from the output terminal OUT of the selector 113. The first arranged data 114a is output from the output terminal OUT of the selector 114.

The memory circuit 120 couples to the first switch circuit 110, the second switch circuit 130, the first control circuit 150 and the second control circuit 160. The memory circuit 120 temporally stores the first arranged data and outputs a plurality of stored data. The memory circuit 120 comprises N memories and N selectors where N is a positive integer. In this embodiment, the memory circuit 120 has four (N=4) memories 121–124 and four (N=4) selectors 125–128. Each memory has a data input terminal DI, a data output terminal DO, an address terminal AD, a writing control terminal WR inputting a write-in enable signal WE and a reading control terminal RD inputting a read-out enable signal RE. Each selector has a first input terminal In1 inputting the first control signal (second selection signal) output from the first control circuit 150, a second input terminal In2 inputting a second control signal (selection signal) output from the second control circuit 160 and an output terminal OUT. The data input terminal DI of the memory 121 couples to the output terminal OUT of the selector 111. The address terminal AD of the memory 121 couples to the output terminal OUT of the selector 125. The data output terminal DO of the memory 121 couples to the second switch circuit 130. The stored data 121a is output from the data output terminal DO of the memory 121. Similarly, the data input terminal DI of the memory 122 couples to the output terminal OUT of the selector 112. The address terminal AD of the memory 122 couples to the output terminal OUT of the selector 126. The data output terminal DO of the memory 122 couples to the second switch circuit 130. The stored data 122a is output from the data output terminal DO of the memory 122. The data input terminal DI of the memory 123 couples to the output terminal OUT of the selector 113. The address terminal AD of the memory 123 couples to the output terminal OUT of the selector 127. The data output terminal DO of the memory 123 couples to the second switch circuit 130. The stored data 123a is output from the data output terminal DO of the memory 123. The data input terminal DI of the memory 124 couples to the output terminal OUT of the selector 114. The address terminal AD of the memory 124 couples to the output terminal OUT of the selector 128. The data output terminal DO of the memory 124 couples to the second switch circuit 130. The stored data 124a is output from the data output terminal DO of the memory 124.

The second switch circuit 130 couples to the memory circuit 120, the parallel-serial circuit 140 and the second control circuit 160. The second switch circuit 130 arranges order of the stored data in response to a second control signal (selection signal) output from the second control circuit 160 and outputs a plurality of second arranged data. The second switch circuit 130 comprises N selectors where N is a positive integer. Each selector has N input terminals and an output terminal OUT. In this embodiment, the second switch circuit 130 has four (N=4) selectors 131–134 and each selector has four (N=4) input terminals I1–I4. All input terminals I1 of all selectors 131–134 couple to the data output terminal DO of the memory 121. Similarly, all input terminals I2 of all selectors 131–134 couple to the data output terminal DO of the memory 122. All input terminals I3 of all selectors 131–134 couple to the data output terminal DO of the memory 123. All input terminals I4 of all selectors 131–134 couple to the data output terminal DO of the memory 124. All output terminals OUT of all selectors 131–134 couple to the parallel-serial circuit 140. The second arranged data 131a is output from the output terminal OUT of the selector 131. Similarly, the second arranged data 132a is output from the output terminal OUT of the selector 132. The second arranged data 133a is output from the output terminal OUT of the selector 133. The second arranged data 134a is output from the output terminal OUT of the selector 134.

The parallel-serial circuit 140 couples to the second switch circuit 130. The parallel-serial circuit 140 has N input terminals where N is a positive integer and an output terminal. The input terminals couple to the second switch circuit 130. In this embodiment, the parallel-serial circuit 140 has four (N=4) input terminals I1–I4. The input terminal I1 of the parallel-serial circuit 140 couples to the output terminal OUT of the selector 131. Similarly, the input terminal I2 couples to the output terminal OUT of the selector 132. The input terminal I3 couples to the output terminal OUT of the selector 133. The input terminal I4 couples to the output terminal OUT of the selector 134. The parallel-serial circuit 140 inputs the second arranged data through the input terminals I1–I4 in parallel by N units. The parallel-serial circuit 140 transforms a data form of the second arranged data from parallel into serial and outputs a serial output data 131a–134a through the output terminal OUT.

The first control circuit 150 couples to the first switch circuit 110 and the memory circuit 120. The first control circuit 150 generates a first control signal 150a based on a write-in clock signal CKW. The first control signal comprises a first selection signal 152a and a second selection signal (address signal ADR1). The first control circuit 150 comprises a counter 151 and a Read-only memory (ROM) 152 coupling to the counter 151. The counter 151 has an input terminal inputting the write-in clock signal CKW and an output terminal outputting the second selection signal (address signal ADR1) based on the write-in clock signal CKW. The output terminal of the counter 151 couples to all first input terminals In1 of all selectors 125–128. The ROM 152 has N addresses where N is a positive integer and stores a lot of information by each address to arrange order of the parallel data. In this embodiment, the ROM 152 has four (N=4) addresses, A1–A4. The information {a1, a2, a3, a4} are stored at the address A1 in the ROM 152. The information {a2, a3, a4, a1} are stored at the address A2 in the ROM 152. The information {a3, a4, a1, a2} are stored at the address A3 in the ROM 152. The information {a4, a1, a2, a3} are stored at the address A4 in the ROM 152. The ROM 152 one-by-one outputs the information by one address in response to the address signal ADR1. The ROM 152 couples to the selectors 111–114.

The second control circuit 160 couples to the memory circuit 120 and the second switch circuit 130. The second control circuit 160 generates a second control signal 160a based on a read-out clock signal CKR. The second control circuit 160 comprises a counter 161 and a Read-only memory (ROM) 162 coupling to the counter 161. The counter 161 has an input terminal inputting the read-out clock signal CKR and an output terminal outputting an address signal ADR2 based on the read-out clock signal CKR. The ROM 162 has N addresses where N is a positive integer and stores a lot of information by each address to arrange order of the stored data. In this embodiment, the ROM 162 has four (N=4) addresses, B1–B4. The information {b1, b4, b3, b2} are stored at the address B1 in the ROM 162. The information {b2, b1, b4, b3} are stored at the address B2 in the ROM 162. The information {b3, b2, b1, b4} are stored at the address B3 in the ROM 162. The information {b4, b3, b2, b1} are stored at the address B4 in the ROM 162. The ROM 162 one-by-one outputs the information by one address in response to the address signal ADR2. The ROM 162 couples to the selectors 131–134 and all second input terminals In2 of all selectors 125–128.

Figure 2:
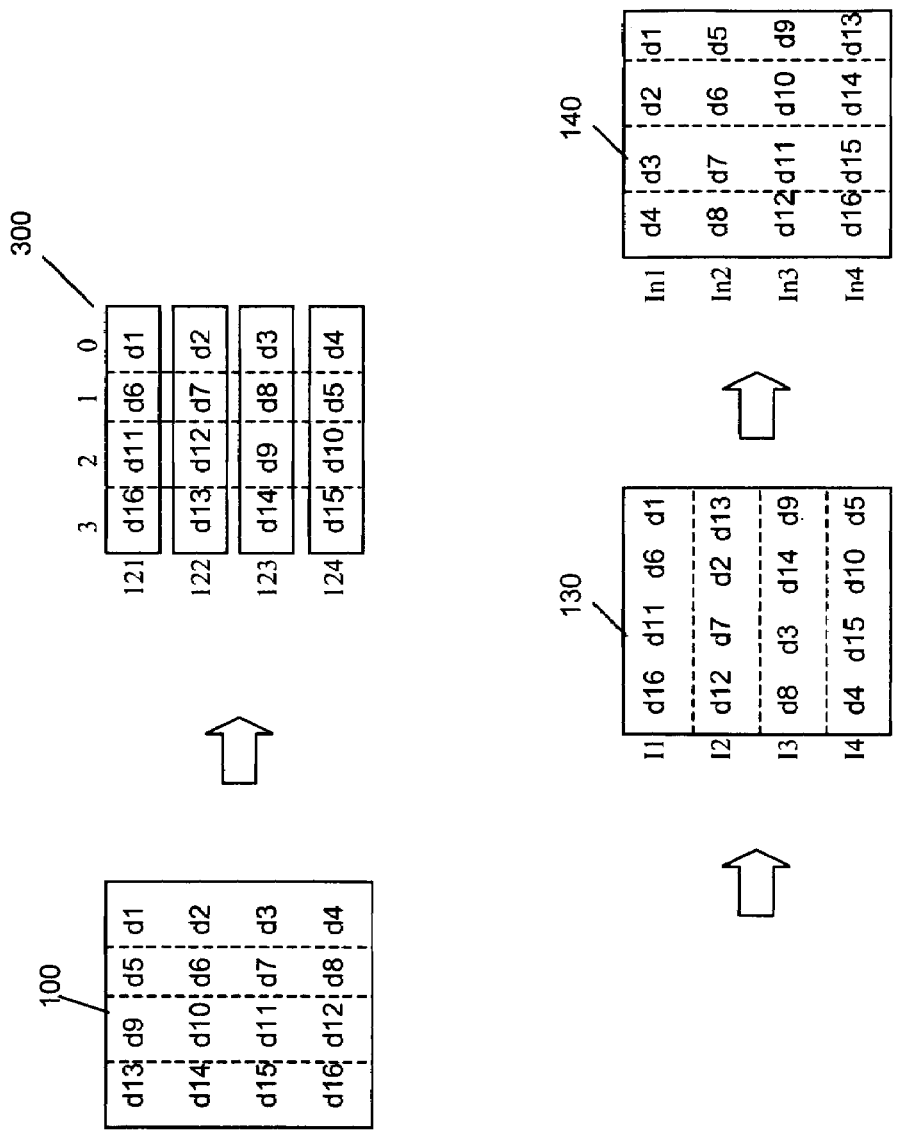
FIG. 2 illustrates a data flow of the apparatus for interleave according to the first preferred embodiment of the present invention.

FIG. 2 illustrates a data flow of the apparatus for interleave according to the first preferred embodiment of the present invention. First, a write-in operation will be described below.

Before the serial-parallel circuit 100 inputs the input data Din, the counter 151 is initialized and outputs "0" (=A1) to the ROM 152 and the first input terminals In1 of the selectors 125–128. The address A1 ("0") is specified in the ROM 152. The information {a1}, {a2}, {a3}, {a4} stored at the address A1 in the ROM 152 is output. Hereby, the information {a1} is input to the selector 111. Similarly, the information {a2} is input to the selector 112. The information {a3} is input to the selector 113. The information {a4} is input to the selector 114.

The serial-parallel circuit 100 inputs the input data Din {d1, d2, d3, . . . , d15, d16}. In this embodiment, the data length is 16 bits. The serial-parallel circuit 100 outputs the parallel data {d1}, {d2}, {d3}, {d4} at the same time. The data {d1} is output through the output terminal O1 to the input terminals I1 of the selectors 111–114. Similarly, the data {d2} is output through the output terminal O2 to the input terminals I2 of the selectors 111–114. The data {d3} is output through the output terminal O3 to the input terminals I3 of the selectors 111–114. The data {d4} is output through the output terminal O4 to the input terminals I4 of the selectors 111–114.

The selector 111 selects the data {d1} from among the parallel data {d1}, {d2}, {d3}, {d4} based on the first selection signal meaning the information {a1} and outputs the selected data {d1} as the first arranged data 111a. Similarly, the selector 112 selects the data {d2} from among the parallel data {d1}, {d2}, {d3}, {d4} based on the first selection signal meaning the information {a2} and outputs the selected data {d2} as the first arranged data 112a. The selector 113 selects the data {d3} from among the parallel data {d1}, {d2}, {d3}, {d4} based on the first selection signal meaning the information {a3} and outputs the selected data {d3} as the first arranged data 113a. The selector 114 selects the data {d4} from among the parallel data {d1}, {d2}, {d3}, {d4} based on the first selection signal meaning the information {a4} and outputs the selected data {d4} as the first arranged data 114a.

The write-in enable signal WE is input to the writing control terminals of all memories 121–124. Afterwards, the memory 121 stores the data {d1} at the address "0"(=A1) which is specified by the selector 125. Similarly, the memory 122 stores the data {d2} at the address "0"(=A1) which is specified by the selector 126. The memory 123 stores the data {d3} at the address "0"(=A1) which is specified by the selector 127. The memory 124 stores the data {d4} at the address "0"(=A1) which is specified by the selector 128.

After all first arranged data {d1}, {d2}, {d3}, {d4} are written into any one of the memories 121–124, the write-in clock signal CKW is input to the counter 151. The counter 151 counts up and outputs "1" (=A2) to the ROM 152 and the first input terminals In1 of the selectors 125–128. The address A2 ("1") is specified in the ROM 152. The information {a2}, {a3}, {a4}, {a1} stored at the address A2 in the ROM 152 is output. Hereby, the information {a2} is input to the selector 111. Similarly, the information {a3} is input to the selector 112. The information {a4} is input to the selector 113. The information {a1} is input to the selector 114. The serial-parallel circuit 100 outputs the parallel data {d6}, {d7}, {d8}, {d9} to the first switch circuit 110. The selector 111 selects the data {d6}, the selector 112 selects the data {d7}, the selector 113 selects the data {d8} and the selector 114 selects the data {d5}. The memory 121 stores the data {d6} at the address "1"(=A2), the memory 122 stores the data {d7} at the address "1"(=A2), the memory 123 stores the data {d8} at the address "1"(=A2) and the memory 124 stores the data {d5} at the address "1"(=A2). Similarly, in regard to the parallel data {d9}, {d10}, {d11}, {d12}, the selector 111 selects the data {d11}, the selector 112 selects the data {d12}, the selector 113 selects the data {d9} and the selector 114 selects the data {d10}. The memory 121 stores the data {d11} at the address "2"(=A3), the memory 122 stores the data {d12} at the address "2"(=A3), the memory 123 stores the data {d9} at the address "2"(=A3) and the memory 124 stores the data {d10} at the address "2"(=A3). In regard to the parallel data {d13}, {d14}, {d15}, {d16}, the selector 111 selects the data {d16}, the selector 112 selects the data {d13}, the selector 113 selects the data {d14} and the selector 114 selects the data {d15}. The memory 121 stores the data {d16} at the address "3"(=A4), the memory 122 stores the data {d13} at the address "3"(=A4), the memory 123 stores the data {d14} at the address "3"(=A4) and the memory 124 stores the data {d15} at the address "3"(=A4).

Next, the read-out operation will be described below.

After all input data Din {d1, d2, d3, . . . , d15, d16} are written into any one of the memories 121–124, the counter 161 is initialized and outputs "0" (=B1) to the ROM 162. The address B1 ("0") is specified in the ROM 162. The information {b1}, {b4}, {b3}, {b2} stored at the address B1 in the ROM 162 is output. Hereby, the information {b1} is input to the selector 131 and the second input terminals In2 of the selector 125. Similarly, the information {b4} is input to the selector 132 and the second input terminals In2 of the selector 126. The information {b3} is input to the selector 133 and the second input terminals In2 of the selector 127. The information {b2} is input to the selector 134 and the second input terminals In2 of the selector 128.

The read-out enable signal RE is input to the reading control terminals RD of all memories 121–124. Afterwards, the data {d1} stored at the address "0" in the memory 121 is read out as the stored data 121a. The address "0" is specified by the information {b1}. Similarly, the data {d13} stored at the address "3" in the memory 122 is read out as the stored data 122a. The address "3" is specified by the information {b4}. The data {d9} stored at the address "2" in the memory 123 is read out as the stored data 123a. The address "2" is specified by the information {b3}. The data {d5} stored at the address "1" in the memory 124 is read out as the stored data 124a. The address "1" is specified by the information {b2}.

The selector 131 selects the data {d1} from among the parallel data {d1}, {d13}, {d9}, {d5} based on the second selection signal meaning the information {b1} and outputs the selected data {d1} as the second arranged data 131a. Similarly, the selector 132 selects the data {d5} from among the parallel data {d1}, {d13}, {d9}, {d5} based on the second selection signal meaning the information {b4} and outputs the selected data {d5} as the second arranged data 132a. The selector 133 selects the data {d9} from among the parallel data {d1}, {d13}, {d9}, {d5} based on the second selection signal meaning the information {b3} and outputs the selected data {d9} as the second arranged data 133a. The selector 134 selects the data {d13} from among the parallel data {d1}, {d13}, {d9}, {d5} based on the second selection signal meaning the information {b2} and outputs the selected data {d 13} as the second arranged data 134a.

The parallel-serial circuit 140 inputs the data {d1} through the input terminal I1, the data {d5} through the input terminal I2, the data {d9} through the input terminal I3 and the data {d13} through the input terminal I4. The parallel-serial circuit 140 outputs the serial output data Dout {d1, d5, d9, d13} through the output terminal OUT.

After serial output data Dout {d1, d5, d9, d13} is output from the parallel-serial circuit 140, the read-out clock signal CKR is input to the counter 161. The counter 161 counts up and outputs "1" (=B2) to the ROM 162. The address B2 ("1") is specified in the ROM 162. The information {b2}, {b1}, {b4}, {b3} stored at the address B2 in the ROM 162 is output. The data {d6} stored in the memory 121, the data {d2} stored in the memory 122, the data {d14} stored in the memory 123 and the data {d10} stored in the memory 124 are read out as the stored data. The selector 131 selects the data {d2}, the selector 132 selects the data {d6}, the selector 133 selects the data {d10} and the selector 134 selects the data {d14}. The parallel-serial circuit 140 outputs the serial output data Dout {d2, d6, d10, d14} through the output terminal OUT. Similarly, in regard to the information {b3}, {b2}, {b1}, {b4} stored at the address B3 in the ROM 162, the data {d11} stored in the memory 121, the data {d7} stored in the memory 122, the data {d3} stored in the memory 123 and the data {d15} stored in the memory 124 are read out as the stored data. The selector 131 selects the data {d3}, the selector 132 selects the data {d7}, the selector 133 selects the data {d11} and the selector 134 selects the data {d15}. The parallel-serial circuit 140 outputs the serial output data Dout {d3, d7, d11, d15} through the output terminal OUT. In regard to the information {b4}, {b3}, {b2}, {b1} stored at the address B4 in the ROM 162, the data {d16} stored in the memory 121, the data {d12} stored in the memory 122, the data {d8} stored in the memory 123 and the data {d4} stored in the memory 124 are read out as the stored data. The selector 131 selects the data {d4}, the selector 132 selects the data {d8}, the selector 133 selects the data {d12} and the selector 134 selects the data {d16}. The parallel-serial circuit 140 outputs the serial output data Dout {d4, d8, d12, d16} through the output terminal OUT.

The input data Din {d1, d2, d3, . . . , d15, d16} is likened to data arranged in the form of a 4×4 matrix X. The output data Dout {d1, d5, d9, d13, d2, d6, d10, d14, d3, d7, d11, d15, d4, d8, d12, d16 } is likened to data arranged in the form of a 4×4 matrix Y In this embodiment, rows of the matrix X equal to columns of the matrix Y. Columns of the matrix X equal to rows of the matrix Y. The apparatus for interleave uses a column-by-column/row-by-row interleaving method.

The apparatus for interleave according to the first preferred embodiment of the present invention interleaves a parallel data at the same time, causing a data processing against CPU to be quickly executed. The apparatus for interleave according to the first preferred embodiment has an advantage in a fast interleaving processing. Specifically, the conventional apparatus for interleave has a two-input, so the conventional apparatus for interleave totally needs 64 cycles for executing a 8-bit data by 4 cycle units. On the other hand, the apparatus for interleave according to the first preferred embodiment totally has a four-input, so the apparatus for interleave according to the first preferred embodiment needs 16 cycles.

Figure 3:
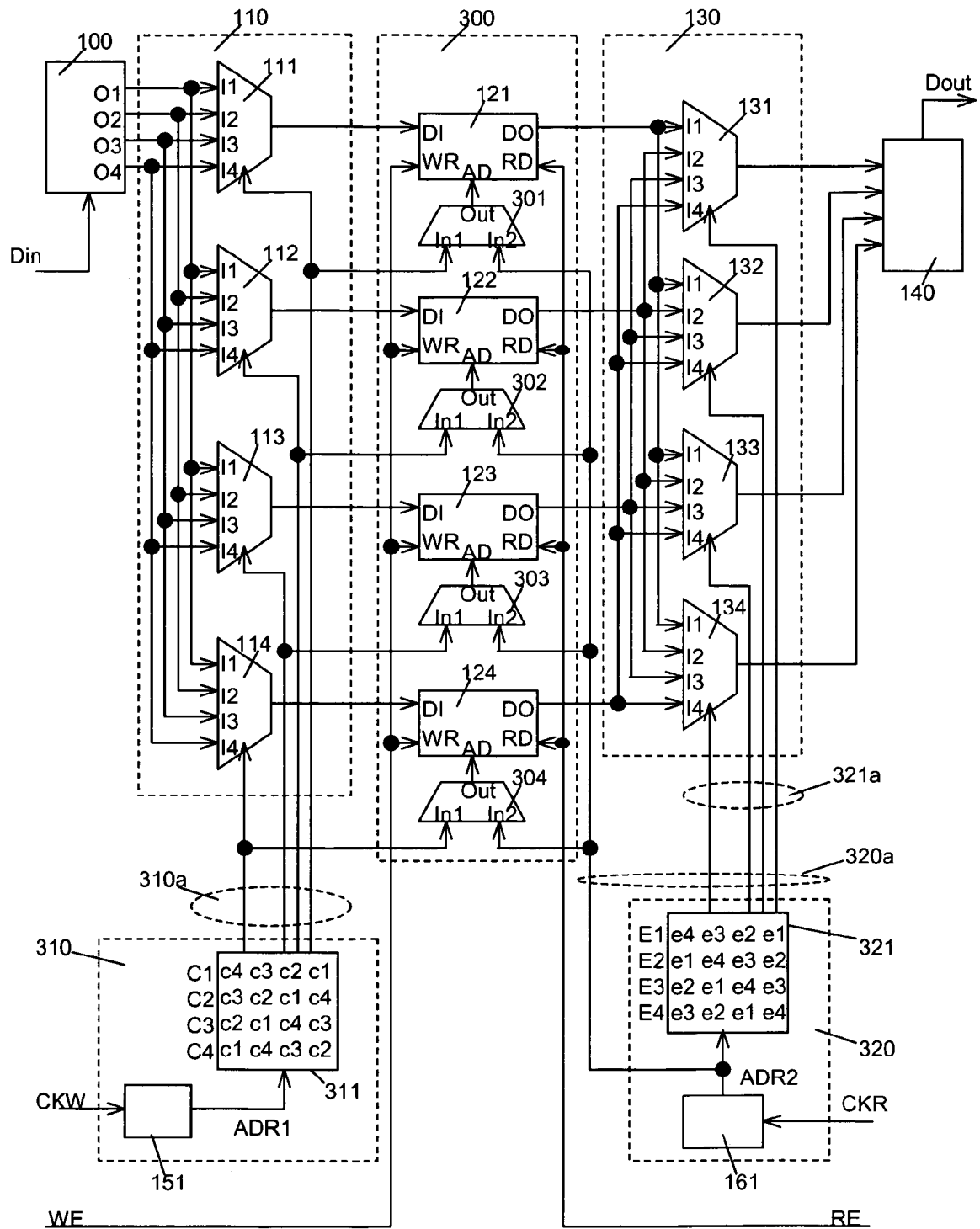
FIG. 3 is a block diagram of an apparatus for interleave according to a second preferred embodiment of the present invention.

FIG. 3 is a block diagram of an apparatus for interleave according to a second preferred embodiment of the present invention. The apparatus for interleave according to the second preferred embodiment of the present invention comprises the serial-parallel circuit 100, the first switch circuit 110, a memory circuit 300, the second switch circuit 130, the parallel-serial circuit 140, a first control circuit 310 and a second control circuit 320. Like elements are given like or corresponding reference numerals in the above-mentioned preferred embodiments to avoid dual explanations of the same elements.

The memory circuit 300 couples to the first switch circuit 110, the second switch circuit 130, the first control circuit 310 and the second control circuit 320. The memory circuit 300 has N selectors where N is a positive integer. In this embodiment, the memory circuit 300 has four (N=4) selectors 301–304. Each selector has a first input terminal In1 coupling to the first control circuit 310 and a second input terminal In2 coupling to the second control circuit 320. The output terminal OUT of the selector 301 couples to the address terminal AD of the memory 121. Similarly, the output terminal OUT of the selector 302 couples to the address terminal AD of the memory 122. The output terminal OUT of the selector 303 couples to the address terminal AD of the memory 123. The output terminal OUT of the selector 304 couples to the address terminal AD of the memory 124.

The first control circuit 310 couples to the first switch circuit 110 and the memory circuit 330. The first control circuit 310 generates a first control signal (selection signal) 310a based on the write-in clock signal CKW. The first control circuit 310 comprises the counter 151 and a Read-only memory (ROM) 311 coupling to the counter 151. The ROM 311 has N addresses where N is a positive integer and stores a lot of information by each address to arrange order of the parallel data. In this embodiment, the ROM 311 has four (N=4) addresses, C1–C4. The information {c1, c2, c3, c4} are stored at the address C1 in the ROM 311. The information {c4, c1, c2, c3} are stored at the address C2 in the ROM 311. The information {c3, c4, c1, c2} are stored at the address C3 in the ROM 311. The information {c2, c3, c4, c1} are stored at the address C4 in the ROM 311. The ROM 311 one-by-one outputs the information by one address in response to the address signal ADR1. The ROM 311 couples to the selectors 111–114 and all first input terminals In1 of all selectors 301–304.

The second control circuit 320 couples to the memory circuit 300 and the second switch circuit 130. The second control circuit 320 generates a second control signal 320a based on the read-out clock signal CKR. The second control signal comprises a first selection signal 321a and a second selection signal (address signal AD2). The second control circuit 320 comprises the counter 161 and a Read-only memory (ROM) 321 coupling to the counter 161. The output terminal of the counter 161 couples to all second input terminals In2 of all selectors 301–304. The ROM 321 has N addresses where N is a positive integer and stores a lot of information by each address to arrange order of the stored data. In this embodiment, the ROM 321 has four (N=4) addresses, E1–E4. The information {e1, e2, e3, e4} are stored at the address El in the ROM 321. The information {e2, e3, e4, e1} are stored at the address E2 in the ROM 321. The information {e3, e4, e1, e2} are stored at the address E3 in the ROM 321. The information {e4, e1, e2, e3} are stored at the address E4 in the ROM 321. The ROM 321 one-by-one outputs the information by one address in response to the address signal ADR2. The ROM 321 couples to the selectors 131–134.

Figure 4:
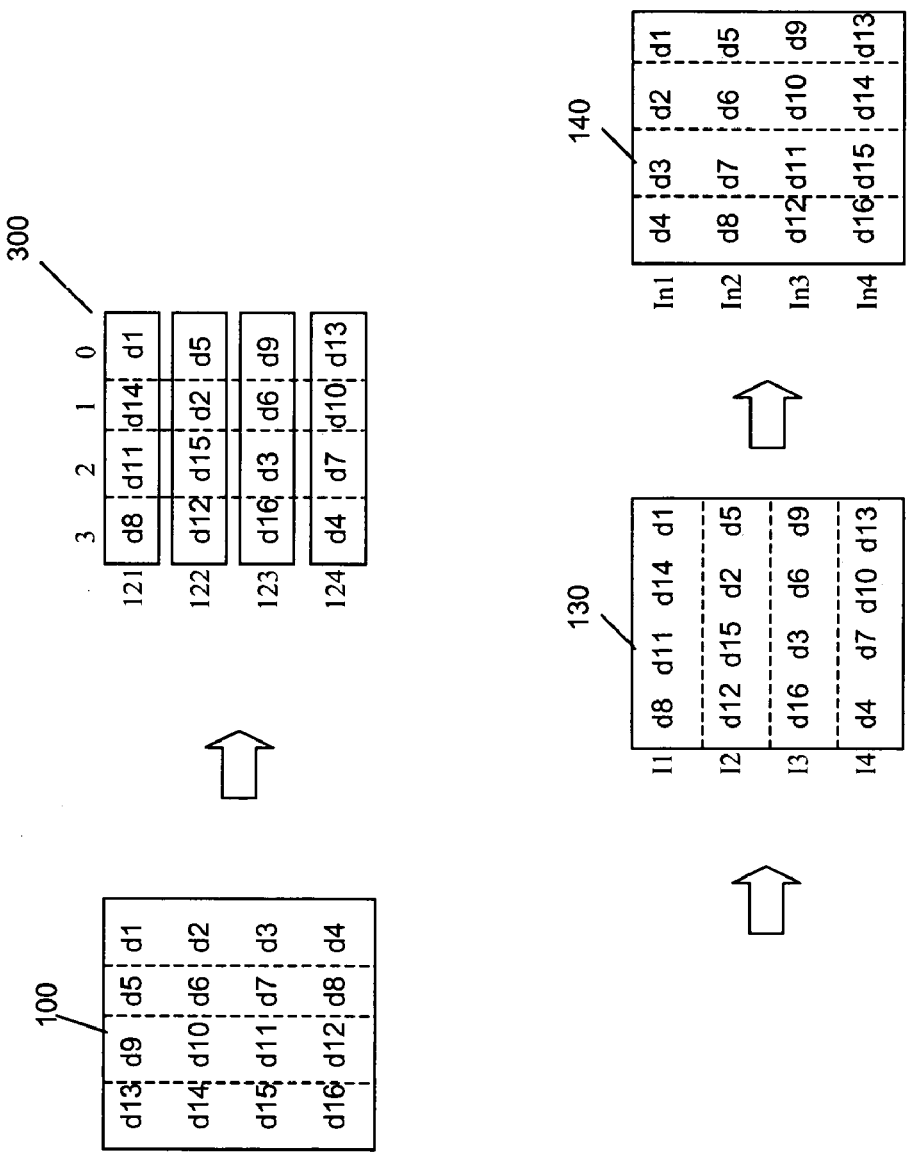
FIG. 4 illustrates a data flow of the apparatus for interleave according to the second preferred embodiment of the present invention.

FIG. 4 illustrates a data flow of the apparatus for interleave according to the second preferred embodiment of the present invention. First, a write-in operation will be described below.

The counter 151 is initialized and outputs "0" (=C1) to the ROM 311. The address C1 ("0") is specified in the ROM 311. The information {c1}, {c2}, {c3}, {c4} stored at the address C1 in the ROM 311 is output. Hereby, the information {c1} is input to the selector 111 and the first input terminal In1 of the selector 301. The information {c2} is input to the selector 112 and the first input terminal In1 of the selector 302. The information {c3} is input to the selector 113 and the first input terminal In1 of the selector 303. The information {c4} is input to the selector 114 and the first input terminal In1 of the selector 304. In regard to the parallel data {d1}, {d2}, {d3}, {d4}, the selector 111 selects the data {d1}, the selector 112 selects the data {d2}, the selector 113 selects the data {d3} and the selector 114 selects the data {d4}. The write-in enable signal WE is input to the writing control terminals of all memories 121–124. Afterwards the memory 121 stores the data {d1} at the address "0"(=c1), the memory 122 stores the data {d2} at the address "1"(=c2), the memory 123 stores the data {d3} at the address "2"(=c3) and the memory 124 stores the data {d4} at the address "3"(=c4).

Similarly, the counter 151 counts up and the information {c4}, {c1}, {c2}, {c3} stored at the address C2 in the ROM 311 is output. In regard to the parallel data {d5}, {d6}, {d7}, {d8}, the selector 111 selects the data {d8}, the selector 112 selects the data {d5}, the selector 113 selects the data {d6} and the selector 114 selects the data {d7}. The memory 121 stores the data {d8} at the address "3", the memory 122 stores the data {d5} at the address "0", the memory 123 stores the data {d6} at the address "1" and the memory 124 stores the data {d7} at the address "2". Similarly, the counter 151 counts up and the information {c3}, {c4}, {c1}, {c2} stored at the address C3 in the ROM 311 is output. In regard to the parallel data {d9}, {d10}, {d1}, {d12}, the selector 111 selects the data {d11}, the selector 112 selects the data {d12}, the selector 113 selects the data {d9} and the selector 114 selects the data {d10}. The memory 121 stores the data {d11} at the address "2", the memory 122 stores the data {d12} at the address "3", the memory 123 stores the data {d9} at the address "0" and the memory 124 stores the data {d10} at the address "1". Similarly, the counter 151 counts up and the information {c2}, {c3}, {c4}, {c1} stored at the address C4 in the ROM 311 is output. In regard to the parallel data {d13}, {d14}, {d15}, {d16}, the selector 111 selects the data {d14}, the selector 112 selects the data {d15}, the selector 113 selects the data {d16} and the selector 114 selects the data {d13}. The memory 121 stores the data {d14} at the address "1", the memory 122 stores the data {d15} at the address "2", the memory 123 stores the data {d16} at the address "3" and the memory 124 stores the data {d13} at the address "0".

Next, the read-out operation will be described below.

After all input data Din {d1, d2, d3, . . . , d15, d16} are written into any one of the memories 121–124, the counter 161 is initialized and outputs "0" (=E1) to the ROM 321 and the second input terminals In2 of the selectors 301–304. The address E1 ("0") is specified in the ROM 321. The information {e1}, {e2}, {e3}, {e4} stored at the address E1 in the ROM 321 is output. Hereby, the information {e1} is input to the selector 131, the information {e2} is input to the selector 132, the information {e3} is input to the selector 133 and the information {e4} is input to the selector 134.

The read-out enable signal RE is input to the reading control terminals RD of all memories 121–124. Afterwards, the data {d1} stored at the address "0"(=E1) in the memory 121, the data {d5} stored at the address "0" in the memory 122, the data {d9} stored at the address "0" in the memory 123 and the data {d13} stored at the address "0" in the memory 124 are read out as the stored data. The address "0" is specified by the address signal ADR2.

The selector 131 selects the data {d1}, the selector 132 selects the data {d5}, the selector 133 selects the data {d9} and the selector 134 selects the data {d13} from among the parallel data {d1}, {d13}, {d9}, {d5} based on the first selection signal 321a. The parallel-serial circuit 140 outputs the serial output data Dout {d1, d5, d9, d13} through the output terminal OUT.

After serial output data Dout {d1, d5, d9, d13} is output from the parallel-serial circuit 140, the read-out clock signal CKR is input to the counter 161. The counter 161 counts up and outputs "1" (=E2) to the ROM 162 and the second input terminals In2 of the selectors 301–304. The address E2 ("1") is specified in the ROM 321. The information {e2}, {e3}, {e4}, {e1} stored at the address E2 in the ROM 321 is output. The data {d14} stored in the memory 121, the data {d2} stored in the memory 122, the data {d6} stored in the memory 123 and the data {d10} stored in the memory 124 are read out as the stored data. The selector 131 selects the data {d2}, the selector 132 selects the data {d6}, the selector 133 selects the data {d10} and the selector 134 selects the data {d14}. The parallel-serial circuit 140 outputs the serial output data Dout {d2, d6, d10, d14} through the output terminal OUT. Similarly, the counter 161 counts up and the information {e3}, {e4}, {e1}, {e2} stored at the address E3 in the ROM 321 is output. The data {d11} stored in the memory 121, the data {d15} stored in the memory 122, the data {d3} stored in the memory 123 and the data {d7} stored in the memory 124 are read out as the stored data. The selector 131 selects the data {d3}, the selector 132 selects the data {d7}, the selector 133 selects the data {d11} and the selector 134 selects the data {d15}. The parallel-serial circuit 140 outputs the serial output data Dout {d3, d7, d11, d15} through the output terminal OUT. Similarly, the counter 161 counts up and the information {e4}, {e1}, {e2}, {e3} stored at the address E4 in the ROM 321 is output. The data {d8} stored in the memory 121, the data {d12} stored in the memory 122, the data {d16} stored in the memory 123 and the data {d4} stored in the memory 124 are read out as the stored data. The selector 131 selects the data {d4}, the selector 132 selects the data {d8}, the selector 133 selects the data {d12} and the selector 134 selects the data {d16}. The parallel-serial circuit 140 outputs the serial output data Dout {d4, d8, d12, d16} through the output terminal OUT.

The input data Din {d1, d2, d3, . . . , d15, d16} is likened to data arranged in the form of a 4×4 matrix X. The output data Dout {d1, d5, d9, d13, d2, d6, d10, d14, d3, d7, d11, d15, d4, d8, d12, d16 } is likened to data arranged in the form of a 4×4 matrix Y. In this embodiment, rows of the matrix X equal to columns of the matrix Y. Columns of the matrix X equal to rows of the matrix Y. The apparatus for interleave uses a column-by-column/row-by-row interleaving method.

The apparatus for interleave according to the second preferred embodiment of the present invention interleaves a parallel data at the same time, causing a data processing against CPU to be quickly executed. The apparatus for interleave according to the second preferred embodiment has an advantage in a fast interleaving processing. In addition, the apparatus for interleave according to the second preferred embodiment of the present invention reads out the data stored at the same address from the memories at the same time. Therefore, the apparatus for interleave according to the second preferred embodiment quickly reads out the data.

Figure 5:
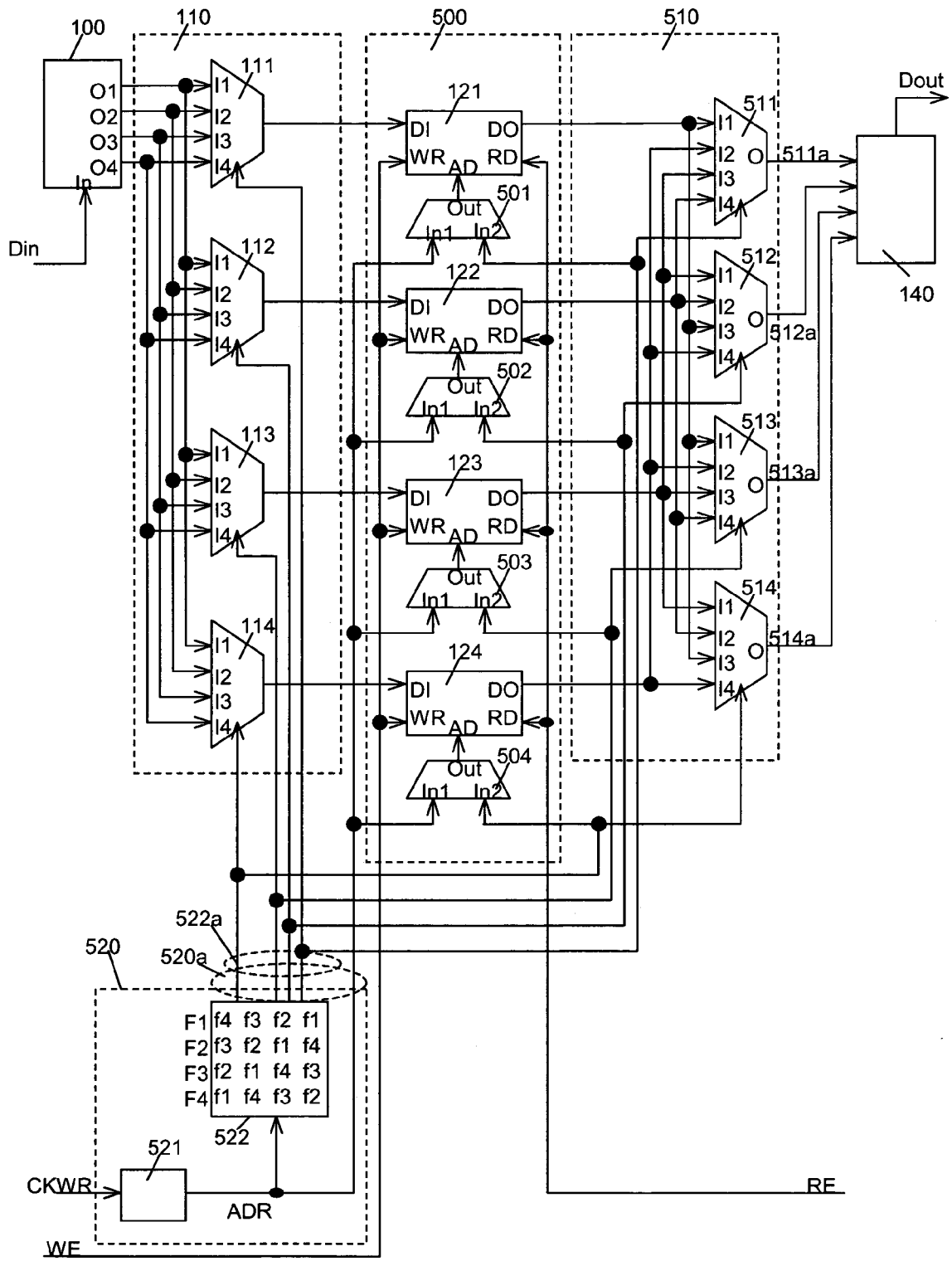
FIG. 5 is a block diagram of an apparatus for interleave according to a third preferred embodiment of the present invention.

FIG. 5 is a block diagram of an apparatus for interleave according to a third preferred embodiment of the present invention. The apparatus for interleave according to the third preferred embodiment of the present invention comprises the serial-parallel circuit 100, the first switch circuit 110, a memory circuit 500, a second switch circuit 510, the parallel-serial circuit 140 and a control circuit 520. Like elements are given like or corresponding reference numerals in the above-mentioned preferred embodiments to avoid dual explanations of the same elements.

The memory circuit 500 couples to the first switch circuit 110, the second switch circuit 510 and the control circuit 520. The memory circuit 500 comprises the memories 121–124 and N selectors where N is a positive integer. In this embodiment, the memory circuit 500 has four (N=4) selectors 501–504. Each selector has a first input terminal In1 and a second input terminal In2. Each of the input terminals In1 and In2 couples to the control circuit 520. All first input terminals In1 of all selectors 501–504 input a control signal (second selection signal). All second input terminals In2 of all selectors 501–504 input the control signal (first selection signal). The output terminal OUT of the selector 501 couples to the address terminal AD of the memory 121. Similarly, the output terminal OUT of the selector 502 couples to the address terminal AD of the memory 122. The output terminal OUT of the selector 503 couples to the address terminal AD of the memory 123. The output terminal OUT of the selector 504 couples to the address terminal AD of the memory 124.

The second switch circuit 510 couples to the memory circuit 500, the parallel-serial circuit 140 and the control circuit 520. The second switch circuit 510 arranges order of the stored data in response to the control signal (first selection signal) output from the control circuit 520 and outputs a plurality of second arranged data. The second switch circuit 510 comprises N selectors where N is a positive integer. Each selector has N input terminals and an output terminal OUT. In this embodiment, the second switch circuit 510 has four (N=4) selectors 511–514 and each selector has four (N=4) input terminals I1–I4. The data output terminal DO of the memory 121 couples to the input terminals I1 of the selectors 511 and 513 and the input terminals I3 of the selectors 512 and 514. The data output terminal DO of the memory 122 couples to the input terminals I4 of the selectors 511 and 513, the input terminals I2 of the selectors 512 and 514. The data output terminal DO of the memory 123 couples to the input terminals I3 of the selectors 511 and 513, the input terminals I1 of the selectors 512 and 514. The data output terminal DO of the memory 124 couples to the input terminals I2 of the selectors 511 and 513, the input terminals I4 of the selectors 512 and 514. All output terminals OUT of all selectors 511–514 couple to the parallel-serial circuit 140. The second arranged data 511a is output from the output terminal OUT of the selector 511. Similarly, the second arranged data 512a is output from the output terminal OUT of the selector 512. The second arranged data 513a is output from the output terminal OUT of the selector 513. The second arranged data 514a is output from the output terminal OUT of the selector 514.

The control circuit 520 couples to the first switch circuit 110, the memory circuit 500 and the second switch circuit 510. The control circuit 520 generates a control signal 520a based on a write-read clock signal CKWR. The control signal comprises a first selection signal 522a and a second selection signal (address signal ADR). The control circuit 520 comprises a counter 521 and a Read-only memory (ROM) 522 coupling to the counter 521. The counter 521 has an input terminal inputting the write-read clock signal CKWR and an output terminal outputting the second selection signal (address signal ADR) based on the write-read clock signal CKWR. The output terminal of the counter 521 couples to all first input terminals In1 of all selectors 501–504. The ROM 522 has N addresses where N is a positive integer and stores a lot of information by each address to arrange order of the parallel data and stored data. In this embodiment, the ROM 522 has four (N=4) addresses, F1–F4. The information {f1, f2, f3, f4} are stored at the address F1 in the ROM 522. The information {f4, f1, f2, f3} are stored at the address F2 in the ROM 522. The information {f3, f4, f1, f2} are stored at the address F3 in the ROM 522. The information {f2, f3, f4, f1} are stored at the address F4 in the ROM 522. The ROM 522 one-by-one outputs the information by one address in response to the address signal ADR. The ROM 522 couples to the selectors 111–114 and 511–514.

Figure 6:
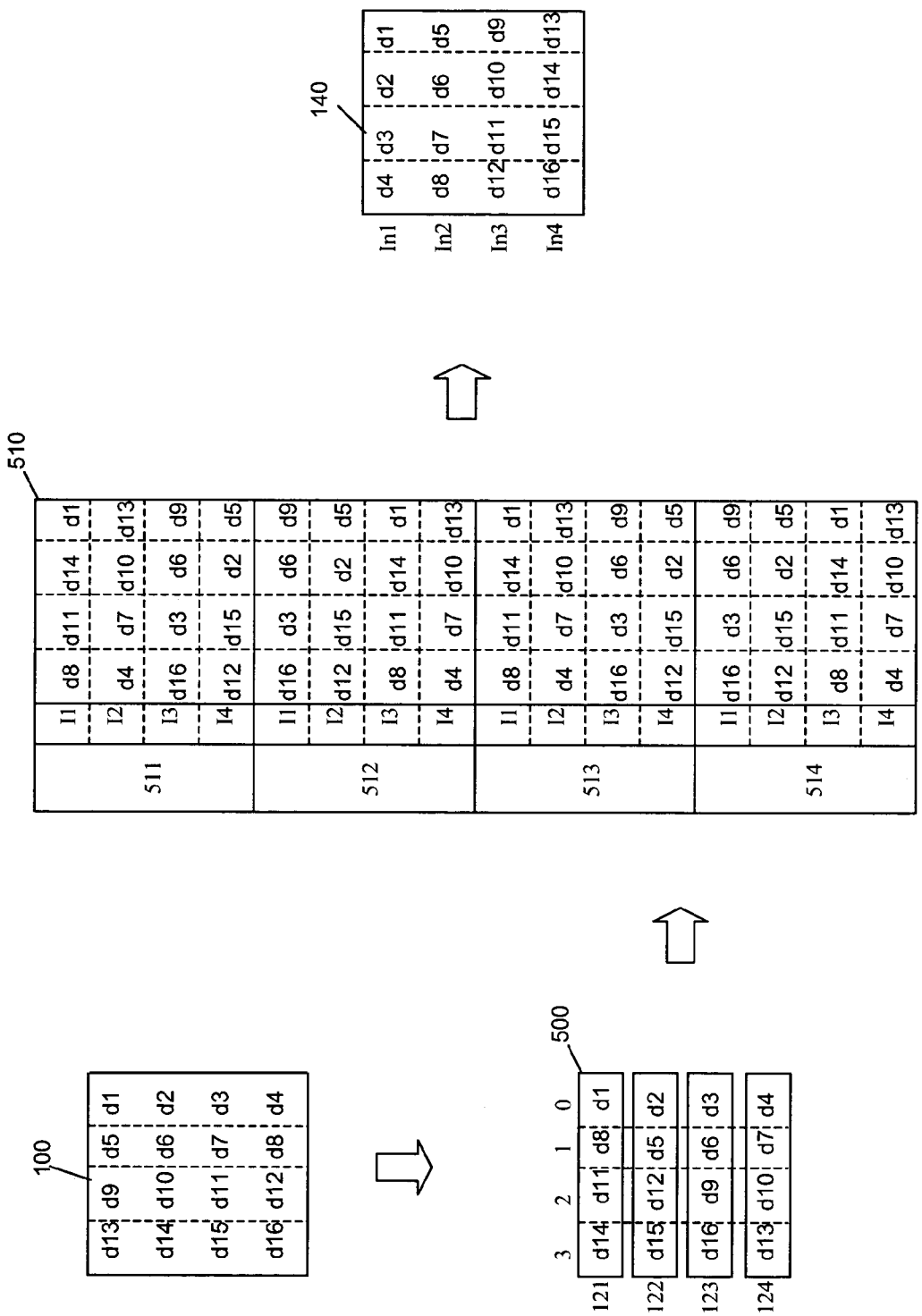
FIG. 6 illustrates a data flow of the apparatus for interleave according to the third preferred embodiment of the present invention.

FIG. 6 illustrates a data flow of the apparatus for interleave according to the third preferred embodiment of the present invention. First, a write-in operation will be described below.

The counter 521 is initialized and outputs "0" (=F1) to the ROM 522 and the first input terminals In1 of the selectors 501–504. The address F1 ("0") is specified in the ROM 522. The information {f1}, {f2}, {f3}, {f4} stored at the address F1 in the ROM 522 is output. Hereby, the information {f1} is input to the selectors 111 and 511 and the second input terminal In2 of the selector 501. Similarly, the information {f2} is input to the selectors 112 and 512 and the second input terminal In2 of the selector 502. The information {f3} is input to the selectors 113 and 513 and the second input terminal In2 of the selector 503. The information {f4} is input to the selectors 114 and 514 and the second input terminal In2 of the selector 504. In regard to the parallel data {d1}, {d2}, {d3}, {d4}, the selector 111 selects the data {d1} based on the first selection signal meaning the information {f1} and outputs the selected data {d1}. The selector 112 selects the data {d2} based on the first selection signal meaning the information {f2} and outputs the selected data {d2}. The selector 113 selects the data {d3} based on the first selection signal meaning the information {f3} and outputs the selected data {d3}. The selector 114 selects the data {d4} based on the first selection signal meaning the information {f4} and outputs the selected data {d4}. The write-in enable signal WE is input to the writing control terminals of all memories 121–124. Afterwards, the memory 121 stores the data {d1} at the address "0"(=F1). The memory 122 stores the data {d2} at the address "0"(=F1). The memory 123 stores the data {d3} at the address "0" (=F1). The memory 124 stores the data {d4} at the address "0"(=F1).

Similarly, the counter 521 counts up and outputs "1" (=F2) to the ROM 522 and the first input terminals In1 of the selectors 501–504. The information {f4}, {f1}, {f2}, {f3} stored at the address F2 in the ROM 522 is output. In regard to the parallel data {d5}, {d6}, {d7}, {d8}, the selector 111 selects the data {d8}, the selector 112 selects the data {d5}, the selector 113 selects the data {d6} and the selector 114 selects the data {d7}. The memory 121 stores the data {d8} at the address "1"(=F2), the memory 122 stores the data {d5} at the address "1"(=F2), the memory 123 stores the data {d6} at the address "1"(=F2) and the memory 124 stores the data {d7} at the address "1"(=F2). Similarly, the counter 521 counts up and the information {f3}, {f4}, {f1}, {f2} stored at the address F3 in the ROM 522 is output. In regard to the parallel data {d9}, {d10}, {d11}, {d12}, the selector 111 selects the data {d11}, the selector 112 selects the data {d12}, the selector 113 selects the data {d9} and the selector 114 selects the data {d10}. The memory 121 stores the data {d11} at the address "2"(=F3), the memory 122 stores the data {d12} at the address "2"(=F3), the memory 123 stores the data {d9} at the address "2"(=F3) and the memory 124 stores the data {d10} at the address "2"(=F3). Similarly, the counter 521 counts up and the information {f2}, {f3}, {f4}, {f1} stored at the address F4 in the ROM 522 is output. In regard to the parallel data {d13}, {d14}, {d15}, {d16}, the selector 111 selects the data {d14}, the selector 112 selects the data {d15}, the selector 113 selects the data {d16} and the selector 114 selects the data {d13}. The memory 121 stores the data {d14} at the address "3"(=F4), the memory 122 stores the data {d15} at the address "3"(=F4), the memory 123 stores the data {d16} at the address "3"(=F4) and the memory 124 stores the data {d13} at the address "3"(=F4).

Next, the read-out operation will be described below. After all input data Din {d1, d2, d3, . . . , d15, d16} are written into any one of the memories 121–124, the counter 521 is initialized and outputs "0" (=F1) to the ROM 522. The address F1 ("0") is specified in the ROM 522. The information {f1}, {f2}, {f3}, {f4} stored at the address F1 in the ROM 522 is output. Hereby, the information {f1} is input to the selectors 111 and 511 and the second input terminals In2 of the selector 501. The information {f2} is input to the selectors 112 and 512 and the second input terminals In2 of the selector 502. The information {f3} is input to the selectors 113 and 513 and the second input terminals In2 of the selector 503. The information {f4} is input to the selectors 114 and 514 and the second input terminals In2 of the selector 504.

The read-out enable signal RE is input to the reading control terminals RD of all memories 121–124. Afterwards, the data {d1} stored at the address "0" in the memory 121 is read out as the stored data. The address "0" is specified by the information {f1}. The data {d5} stored at the address "1" in the memory 122 is read out as the stored data. The address "1" is specified by the information {f2}. The data {d9} stored at the address "2" in the memory 123 is read out as the stored data. The address "2" is specified by the information {f3}. The data {d13} stored at the address "3" in the memory 124 is read out as the stored data. The address "3" is specified by the information {f4}.

The selector 511 selects the data {d1} from among the parallel data {d1}, {d13}, {d9}, {d5} based on the second selection signal meaning the information {f1} and outputs the selected data {d1}. The selector 512 selects the data {d5} from among the parallel data {d1}, {d13}, {d9}, {d5} based on the second selection signal meaning the information {f2} and outputs the selected data {d5}. The selector 513 selects the data {d9} from among the parallel data {d1}, {d13}, {d9}, {d5} based on the second selection signal meaning the information {f3} and outputs the selected data {d9}. The selector 514 selects the data {d13} from among the parallel data {d1}, {d13}, {d9}, {d5} based on the second selection signal meaning the information {f4} and outputs the selected data {d13}. The parallel-serial circuit 140 inputs the data {d1} through the input terminal I1, the data {d5} through the input terminal I2, the data {d9} through the input terminal I3 and the data {d13} through the input terminal I4. The parallel-serial circuit 140 outputs the serial output data Dout {d1, d5, d9, d13} through the output terminal OUT.

After serial output data Dout {d1, d5, d9, d13} is output from the parallel-serial circuit 140, the write-read clock signal CKWR is input to the counter 521. The counter 521 counts up and outputs "1" (=F2) to the ROM 521. The address F2 ("1") is specified in the ROM 521. The information {f4}, {f1}, {f2}, {f3} stored at the address F2 in the ROM 521 is output. The data {d14} stored in the memory 121, the data {d2} stored in the memory 122, the data {d6} stored in the memory 123 and the data {d10} stored in the memory 124 are read out as the stored data. The selector 511 selects the data {d2}, the selector 512 selects the data {d6}, the selector 513 selects the data {d10} and the selector 514 selects the data {d14}. The parallel-serial circuit 140 outputs the serial output data Dout {d2, d6, d10, d14} through the output terminal OUT. Similarly, the counter 521 counts up and the information {f3}, {f4}, {f1}, {f2} stored at the address F3 in the ROM 522 is output. The data {d11} stored in the memory 121, the data {d15} stored in the memory 122, the data {d3} stored in the memory 123 and the data {d7} stored in the memory 124 are read out as the stored data. The selector 511 selects the data {d3}, the selector 512 selects the data {d7}, the selector 513 selects the data {d11} and the selector 514 selects the data {d15}. The parallel-serial circuit 140 outputs the serial output data Dout {d3, d7, d11, d15} through the output terminal OUT. Similarly, the counter 521 counts up and the information {f2}, {f3}, {f4}, {f1} stored at the address F4 in the ROM 522, the data {d8} stored in the memory 121, the data {d12} stored in the memory 122, the data {d16} stored in the memory 123 and the data {d4} stored in the memory 124 are read out as the stored data. The selector 511 selects the data {d4}, the selector 512 selects the data {d8}, the selector 513 selects the data {d12} and the selector 514 selects the data {d16}. The parallel-serial circuit 140 outputs the serial output data Dout {d4, d8, d12, d16} through the output terminal OUT.

The input data Din {d1, d2, d3, . . . , d15, d16} is likened to data arranged in the form of a 4×4 matrix X. The output data Dout {d1, d5, d9, d13, d2, d6, d10, d14, d3, d7, d11, d15, d4, d8, d12, d16 } is likened to data arranged in the form of a 4×4 matrix Y. In this embodiment, rows of the matrix X equal to columns of the matrix Y. Columns of the matrix X equal to rows of the matrix Y. The apparatus for interleave uses a column-by-column/row-by-row interleaving method.

The apparatus for interleave according to the third preferred embodiment of the present invention interleaves a parallel data at the same time, causing a data processing against CPU to be quickly executed. The apparatus for interleave according to the third preferred embodiment has an advantage in a fast interleaving processing. In addition, the apparatus for interleave according to the third preferred embodiment of the present invention has only one control circuit to control the first switch circuit, the memory and the second switch circuit. Therefore, the apparatus for interleave according to the third preferred embodiment reduces a circuit size.

Figure 7:
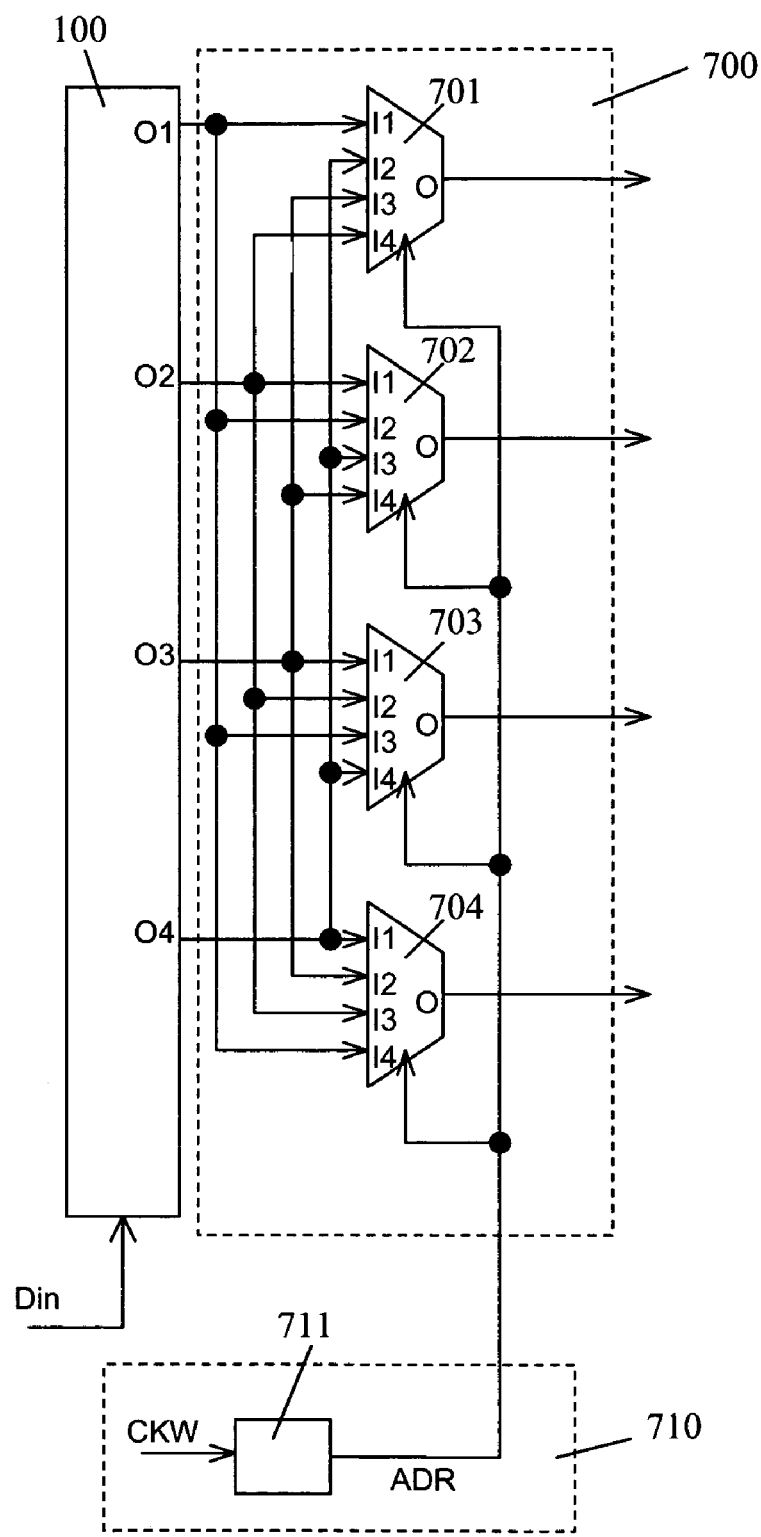
FIG. 7 is a block diagram of a part of an apparatus for interleave according to a fourth preferred embodiment of the present invention.

FIG. 7 is a block diagram of a part of an apparatus for interleave according to a fourth preferred embodiment of the present invention. FIG. 7 shows the serial-parallel circuit 100, the first switch circuit 700 and a control circuit 710.

Like elements are given like or corresponding reference numerals in the above-mentioned preferred embodiments to avoid dual explanations of the same elements.

The first switch circuit 700 arranges order of the parallel data in response to a control signal (address signal) output from the control circuit 710 and outputs a plurality of first arranged data. The first switch circuit 700 comprises N selectors where N is a positive integer. Each selector has N input terminals and an output terminal OUT. In this embodiment, the first switch circuit 700 has four (N=4) selectors 701–704 and each selector has four (N=4) input terminals I1–I4. The output terminal O1 of the serial-parallel circuit 100 is coupled to the input terminal I1 of the selector 701, the input terminal I2 of the selector 702, the input terminal 13 of the selector 703 and the input terminal I4 of the selector 704. The output terminal O2 of the serial-parallel circuit 100 is coupled to the input terminal I4 of the selector 701, the input terminal I1 of the selector 702, the input terminal I2 of the selector 703 and the input terminal 13 of the selector 704. The output terminal O3 of the serial-parallel circuit 100 is coupled to the input terminal 13 of the selector 701, the input terminal I4 of the selector 702, the input terminal I1 of the selector 703 and the input terminal I2 of the selector 704. The output terminal O4 of the serial-parallel circuit 100 is coupled to the input terminal I2 of the selector 701, the input terminal 13 of the selector 702, the input terminal I4 of the selector 703 and the input terminal I1 of the selector 704. All output terminals OUT of all selectors 701–704 couple to the memory circuit.

The control circuit 710 couples to the first switch circuit 700. The control circuit 710 generates a control signal (address signal ADR) based on the write-in clock signal CKW. The control circuit 710 comprises a counter 711. The counter 711 has an input terminal inputting the write-in clock signal CKW and an output terminal outputting the address signal ADR based on the write-in clock signal CKW. The output terminal of the counter 711 couples to the selectors 701–704.

Figure 8:
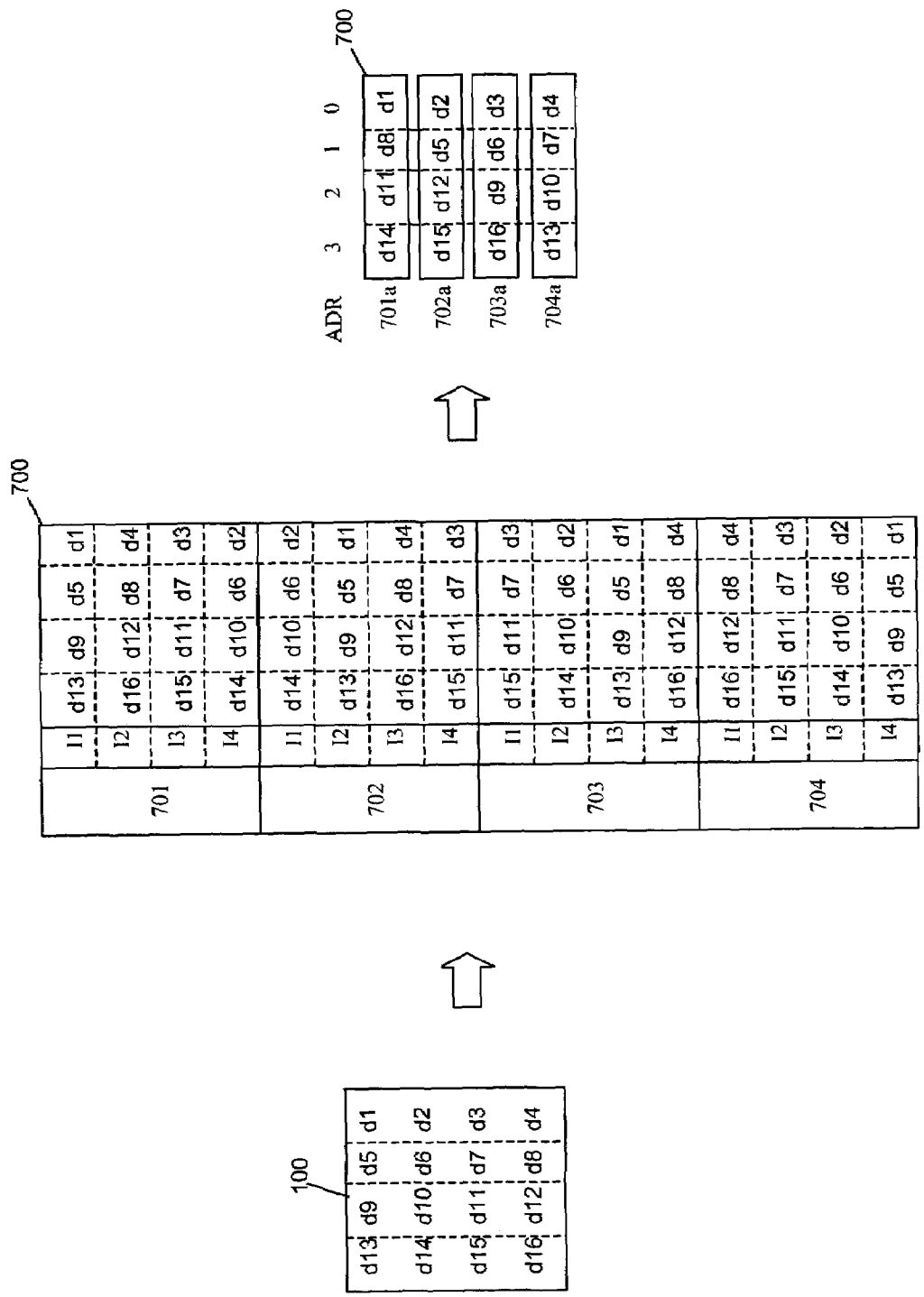
FIG. 8 illustrates a data flow of the apparatus for interleave according to the fourth preferred embodiment of the present invention.

FIG. 8 illustrates a data flow in a write-in operation of the apparatus for interleave according to the fourth preferred embodiment of the present invention.

The counter 711 is initialized and outputs "0" (address signal ADR) and the selectors 701–704. In regard to the parallel data {d1}, {d2}, {d3}, {d4}, the selector 701 selects the data {d1} based on "0" (address signal ADR) and outputs the selected data {d1}. The selector 702 selects the data {d2} based on "0" and outputs the selected data {d2}. The selector 703 selects the data {d3} based on "0" and outputs the selected data {d3}. The selector 704 selects the data {d4} based on "0" and outputs the selected data {d4}.

Similarly, the counter 711 counts up and outputs "1" to the selectors 701–704. The selector 701 selects the data {d8}, the selector 702 selects the data {d5}, the selector 703 selects the data {d6} and the selector 704 selects the data {d7}. Similarly, in regard to the parallel data {d9}, {d10}, {d11}, {d12}, the selector 701 selects the data {d11}, the selector 702 selects the data {d12}, the selector 703 selects the data {d9} and the selector 704 selects the data {d10}. In regard to the parallel data {d13}, {d14}, {d15}, {d16}, the selector 701 selects the data {d14}, the selector 702 selects the data {d15}, the selector 703 selects the data {d16} and the selector 704 selects the data {d13}.

The apparatus for interleave according to the fourth preferred embodiment of the present invention reads out the stored data in the memory circuit using the same a read-out operation as the apparatus for interleave according to the third preferred embodiment.

The input data Din {d1, d2, d3, . . . , d15, d16} is likened to data arranged in the form of a 4×4 matrix X. The output data Dout {d1, d5, d9, d13, d2, d6, d10, d14, d3, d7, d11, d15, d4, d8, d12, d16 } is likened to data arranged in the form of a 4×4 matrix Y. In this embodiment, rows of the matrix X equal to columns of the matrix Y. Columns of the matrix X equal to rows of the matrix Y. The apparatus for interleave uses a column-by-column/row-by-row interleaving method.

The apparatus for interleave according to the fourth preferred embodiment of the present invention interleaves a parallel data at the same time, causing a data processing against CPU to be quickly executed. The apparatus for interleave according to the fourth preferred embodiment has an advantage in a fast interleaving processing. In addition, the apparatus for interleave according to the fourth preferred embodiment of the present invention has a counter to control the first switch circuit. Therefore, the apparatus for interleave according to the fourth preferred embodiment reduces a circuit size.

By the way, it goes without saying that the control circuit of this preferred embodiment may be applied to the apparatus for interleave in FIGS. 1 and 3 instead of the second control circuit.

Figure 9:
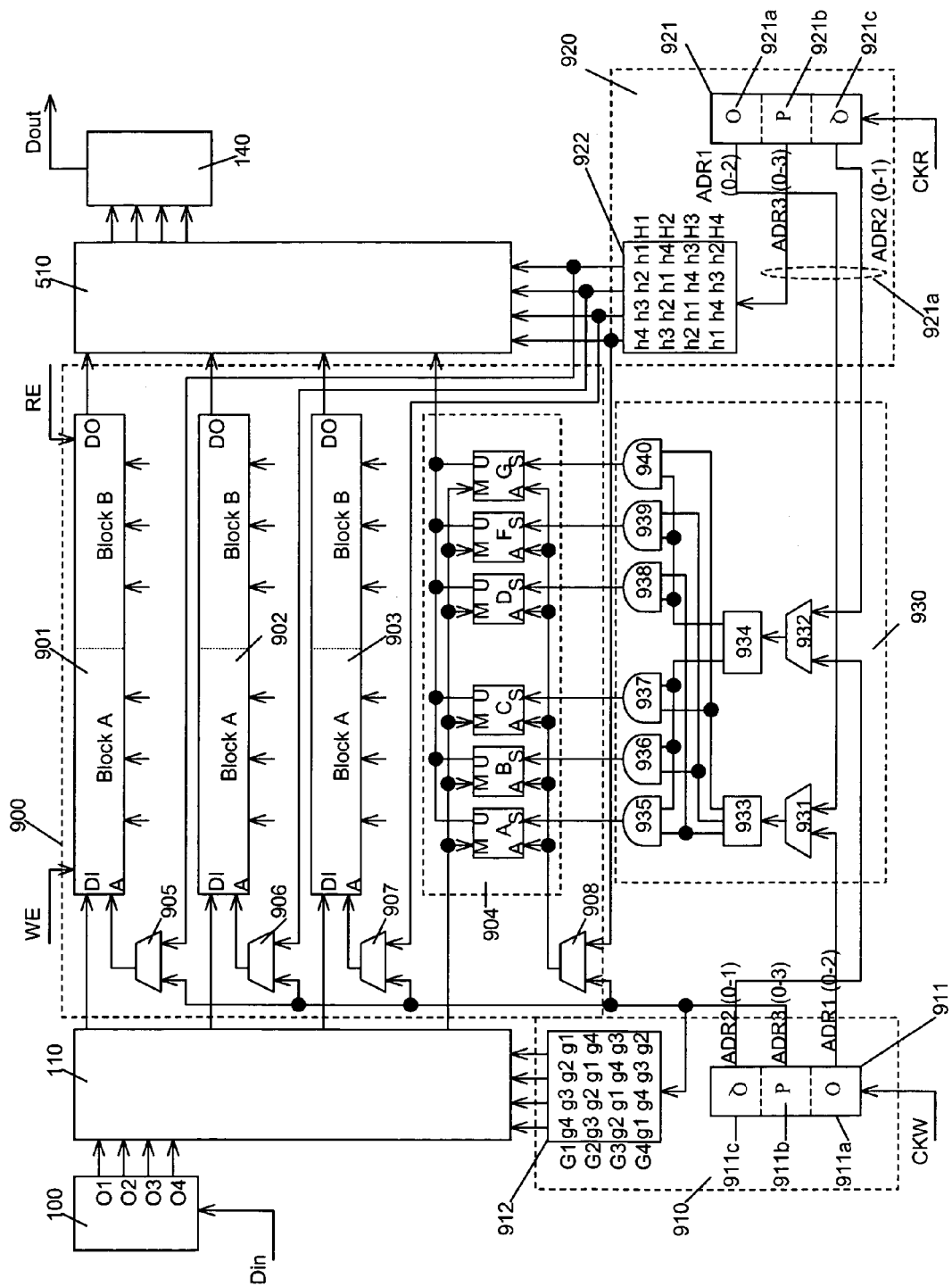
FIG. 9 is a block diagram of an apparatus for interleave according to a fifth preferred embodiment of the present invention.

FIG. 9 is a block diagram of an apparatus for interleave according to a fifth preferred embodiment of the present invention. The above preferred embodiments mention replacing rows with columns in an n×n matrix. The apparatus for interleave according to the fifth preferred embodiment mentions replacing rows with columns in an N×L matrix and an M×L matrix where N, M and L are positive integers.

The apparatus for interleave according to the fifth preferred embodiment of the present invention comprises the serial-parallel circuit 100, the first switch circuit 110, a memory circuit 900, the second switch circuit 510, the parallel-serial circuit 140, a first control circuit 910, a second control circuit 920 and a third control circuit 930. The apparatus for interleave according to the fifth preferred embodiment of the present invention interleaves replaces rows with columns in the matrix. Like elements are given like or corresponding reference numerals in the above-mentioned preferred embodiments to avoid dual explanations of the same elements.

The memory circuit 900 couples to the first switch circuit 110, the second switch circuit 510, the first control circuit 910, the second control circuit 920 and the third control circuit 930. The memory circuit 900 comprises L memories and L selectors where L is a positive integer. Each memory has a data input terminal DI, an address terminal A and a data output terminal DO. Each selector has a first input terminal In1, a second input terminal In2 and an output terminal OUT. All data input terminals DI of all memories couple to the first switch circuit 110. All data output terminals DO of all memories couple to the second switch circuit 510. The selector one-on-one couples to the memory. The output terminal OUT of the selector couples to the address terminal A of the memory. All first input terminal In1 of the selector couple to the first control circuit 910. All second input terminal In2 of the selector couple to the second control circuit 920. In this embodiment, the memory circuit 900 has four (L=4) memories 901–904 and four (L=4) selectors 905–908. Each memory is divided into N blocks where N is a positive integer. In this embodiment, each memory is divided into two (N=2) blocks A–B. Each block has M memory units where M is a positive integer. Each memory unit couples to the data input terminal DI of the memory in common, the data output terminal DO of the memory in common, the address terminal A of the memory in common and the third control circuit 930. In this embodiment, each block has three (M=3) memory units. For example, the memory 904 is divided into a block A having memory units A–C and a block B having memory units D–F. All memory units A–F couple to the first switch circuit 110, the second switch circuit 510, the third switch circuit 930 and the selector 908.

The first control circuit 910 couples to the first switch circuit 110, the memory circuit 900 and the third control circuit 930. The first control circuit 910 generates a first control signal 910a and a second control signal 910b (address signal) based on a write-in clock signal CKW. The second control signal 910b comprises a first address signal ADR1, a second address signal ADR2 and a third address signal ADR3. The first control circuit 910 comprises a counter 911 and a Read-only memory (ROM) 912 coupling to the counter 911. The counter 911 inputs the write-in clock signal CKW and outputs the second control signal 910b. The counter 911 is divided into three counter portions 911a–911c. The counter portion 911a employs a notation system of base O where O is a positive integer and outputs the first address signal ADR1 to be input to the third control circuit 930. The counter portion 911b employs a notation system of base P where P is a positive integer and outputs the third address signal ADR3 to be input to the memory circuit 900 and the ROM 912. The counter portion 911c employs a notation system of base Q where Q is a positive integer and outputs the second address signal ADR2 to be input to the third control circuit 930. The ROM 912 has L addresses where L is a positive integer and stores a lot of information by each address to arrange order of the parallel data. In this embodiment, the ROM 912 has four (L=4) addresses, G1–G4. The information {g1, g2, g3, g4} are stored at the address G1 in the ROM 912. The information {g4, g1, g2, g3} are stored at the address G2 in the ROM 912. The information {g3, g4, g1, g2} are stored at the address G3 in the ROM 912. The information {g2, g3, g4, g1} are stored at the address G4 in the ROM 912. The ROM 912 one-by-one outputs the information by one address in response to the third address signal ADR3. The ROM 912 couples to the first switch circuit 110.

The second control circuit 920 couples to the memory 900, the second switch circuit 510 and the third control circuit 930. The second control circuit 920 generates a first control signal 920a and a second control signal 920b based on a read-out clock signal CKR. The second control signal 920b comprises a first address signal ADR1, a second address signal ADR2 and a third address signal ADR3. The second control circuit 920 comprises a counter 921 and a Read-only memory (ROM) 922 coupling to the counter 921. The counter 921 inputs the read-out clock signal CKR and outputs the second control signal 920b. The counter 921 is divided into three counter portions 921a–921c. The counter portion 921a employs a notation system of base O where O is a positive integer and outputs the first address signal ADR1 to be input to the third control circuit 930. The counter portion 921b employs a notation system of base P where P is a positive integer and outputs the second address signal ADR3 to be input to the ROM 922. The counter portion 921c employs a notation system of base Q where Q is a positive integer and outputs the second address signal ADR2 to be input to the third control circuit 930. The ROM 922 has L addresses where L is a positive integer and stores a lot of information by each address to arrange order of the stored data. In this embodiment, the ROM 922 has four (L=4) addresses, H1–H4. The information {h1, h2, h3, h4} are stored at the address H1 in the ROM 922. The information {h4, h1, h2, h3} are stored at the address H2 in the ROM 922. The information {h3, h4, h1, h2} are stored at the address H3 in the ROM 922. The information {h2, h3, h4, h1} are stored at the address H4 in the ROM 922. The ROM 922 one-by-one outputs the information by one address in response to the third address signal ADR3. The ROM 922 couples to the memory 900 and the second switch circuit 510.

The third control circuit 930 couples to the memory 900, the first control circuit 910 and the second control circuit 920. The third control circuit 930 generates a selection signal 930a. The third control circuit 930 comprises selectors 931–932, decoders 933–934 and AND circuits 935–940. The selector 931 has a first input terminal coupling to the counter portion 911a, a second terminal coupling to the counter portion 921a and an output terminal coupling to the decoder 933. The selector 932 has a first input terminal coupling to the counter portion 911c, a second input terminal coupling to the counter portion 921c and an output terminal coupling to the decoder 934. The decoder 933 has a first output terminal coupling to the input terminals of the AND circuits 935 and 938, a second output terminal coupling to the input terminals of the AND circuits 936 and 939 and a third output terminal coupling to the input terminals of the AND circuits 937 and 940. The decoder 934 has a first output terminal coupling to the input terminals of the AND circuits 935–937 and a second output terminal coupling to the input terminals of the AND circuits 938–940. The output terminals of the AND circuits 935–940 couple to the memory circuit 900. Specifically, the output terminal of the AND circuit 935 couples to the memory unit A. The output terminal of the AND circuit 936 couples to the memory unit B. The output terminal of the AND circuit 937 couples to the memory unit C. The output terminal of the AND circuit 938 couples to the memory unit D. The output terminal of the AND circuit 939 couples to the memory unit E. The output terminal of the AND circuit 940 couples to the memory unit F.

FIG. 10 illustrates a data flow of the apparatus for interleave according to the fifth preferred embodiment of the present invention. First, a write-in operation will be described below.

Before the serial-parallel circuit 100 inputs the input data Din, the counter 911 is initialized and the counter portions 911a–911c become "0"{(O, P, Q)=(1, 0, 0)}. The address G1 ("0") is specified in the ROM 912. The information {g1}, {g2}, {g3}, {g4} stored at the address G1 in the ROM 912 is output.

The serial-parallel circuit 100 inputs the input data Din {d1, d2, d3, . . . , d95, d96}. In regard to the input data Din {d1, d2, d3, d4}, the parallel data {d1} is stored at the address "0" in the memory unit A in the block A in the memory 901. Similarly, the parallel data {d2} is stored at the address "0" in the memory unit A in the block A in the memory 902. The parallel data {d3} is stored at the address "0" in the memory unit A in the block A in the memory 903. The parallel data {d4} is stored at the address "0" in the memory unit A in the block A in the memory 904.

After all first arranged data {d1, d2, d3, d4} are written into any one of the memories 901–904, the write-in clock signal CKW is input to the counter 911. The counter 911 counts up and outputs (O, P, Q)=(1, 0, 0). In regard to the input data Din {d5, d6, d7, d8}, the parallel data {d5} is stored at the address "0" in the memory unit B in the block A in the memory 901. Similarly, the parallel data {d6} is stored at the address "0" in the memory unit B in the block A in the memory 902. The parallel data {d7} is stored at the address "0" in the memory unit B in the block A in the memory 903. The parallel data {d8} is stored at the address "0" in the memory-unit B in the block A in the memory 904. Similarly, in regard to the input data Din {d9, d10, d11, d12}, the parallel data {d9} is stored at the address "0" in the memory unit C in the block A in the memory 901. The parallel data {d10} is stored at the address "0" in the memory unit C in the block A in the memory 902. The parallel data {d11} is stored at the address "0" in the memory unit C in the block A in the memory 903. The parallel data {d12} is stored at the address "0" in the memory unit C in the block A in the memory 904. Similarly, the counter 911 counts up and outputs (O, P, Q)=(2, 0, 0). In regard to the input data Din {d9, d10, d11, d12}, the parallel data {d9} is stored at the address "0" in the memory unit C in the block A in the memory 901. The parallel data {d10} is stored at the address "0" in the memory unit C in the block A in the memory 902. The parallel data {d11} is stored at the address "0" in the memory unit C in the block A in the memory 903. The parallel data {d12} is stored at the address "0" in the memory unit C in the block A in the memory 904.

Furthermore, the counter 911 counts up and outputs (O, P, Q)=(0, 1, 0). The information {g4}, {g1}, {g2}, {g3} stored at the address G2 in the ROM 912 is output. In regard to the input data Din {d13, d14, d15, d16}, the parallel data {d16} is stored at the address "1" in the memory unit A in the block A in the memory 901. The parallel data {d13} is stored at the address "1" in the memory unit A in the block A in the memory 902. The parallel data {d14} is stored at the address "1" in the memory unit A in the block A in the memory 903. The parallel data {d15} is stored at the address "1" in the memory unit A in the block A in the memory 904.

Similarly, in regard to the input data Din {d93, d94, d95, d96}, the parallel data {d94} is stored at the address "3" in the memory unit C in the block B in the memory 901. The parallel data {d95} is stored at the address "3" in the memory unit C in the block B in the memory 902. The parallel data {d96} is stored at the address "3" in the memory unit C in the block B in the memory 903. The parallel data {d93} is stored at the address "3" in the memory unit C in the block B in the memory 904.

Next, the read-out operation will be described below.

After all input data Din {d1, d2, d3, . . . , d95, d96} are written into any one of the memories 901–904, the counter 921 is initialized and the counter portions 921a–921c become "0"{(O, P, Q)=(0, 0, 0)}. The address H1 ("0") is specified in the ROM 922. The information {h1}, {h2}, {h3}, {h4} stored at the address H1 in the ROM 922 is output.

The read-out enable signal RE is input to all memories 901–904. Afterwards, the data {d1} stored at the address "0" in the memory unit A in the block A in the memory 901 is read out. The address "0" is specified by the information {h1}. The data {d13} stored at the address "1" in the memory unit A in the block A in the memory 902 is read out. The address "1" is specified by the information {h2}. The data {d25} stored at the address "2" in the memory unit A in the block A in the memory 903 is read out. The address "2" is specified by the information {h3}. The data {d37} stored at the address "3" in the memory unit A in the block A in the memory 904 is read out. The address "3" is specified by the information {h4}. After the second switch circuit 510 sorts the read-out data, the parallel-serial circuit 140 outputs the output data Dout {d1, d13, d25, d37}.

Next, the counter 921 counts up and outputs (O, P, Q)=(0, 0, 1). The data {d49} stored at the address "0" in the memory unit D in the block B in the memory 901 is read out. The data {d61} stored at the address "1" in the memory unit D in the block B in the memory 902 is read out. The data {d73} stored at the address "2" in the memory unit D in the block B in the memory 903 is read out. The data {d85} stored at the address "3" in the memory unit D in the block B in the memory 904 is read out. After the second switch circuit 510 sorts the read-out data, the parallel-serial circuit 140 outputs the output data Dout {d49, d61, d73, d85}.

Next, the counter 921 counts up and outputs (O, P, Q)=(0, 1, 0). The address H2 ("1") is specified in the ROM 922. The information {h4}, {h1}, {h2}, {h3} stored at the address H2 in the ROM 922 is output. The data {d38} stored at the address "3" in the memory unit A in the block A in the memory 901 is read out. The address "3" is specified by the information {h4}. The data {d2} stored at the address "0" in the memory unit A in the block A in the memory 902 is read out. The address "0" is specified by the information {h1}. The data {d14} stored at the address "1" in the memory unit A in the block A in the memory 903 is read out. The address "1" is specified by the information {h2}. The data {d26} stored at the address "2" in the memory unit A in the block A in the memory 904 is read out. The address "2" is specified by the information {h3}. After the second switch circuit 510 sorts the read-out data, the parallel-serial circuit 140 outputs the output data Dout {d2, d14, d26, d38}.

Similarly, the data {d72} stored at the address "1" in the memory unit C in the block B in the memory 901 is read out. The address "1" is specified by the information {h2}. The data {d84} stored at the address "2" in the memory unit C in the block B in the memory 902 is read out. The address "2" is specified by the information {h3}. The data {d96} stored at the address "3" in the memory unit C in the block B in the memory 903 is read out. The address "3" is specified by the information {h4}. The data {d60} stored at the address "0" in the memory unit C in the block B in the memory 904 is read out. The address "0" is specified by the information {h1}. After the second switch circuit 510 sorts the read-out data, the parallel-serial circuit 140 outputs the output data Dout {d60, d72, d84, d96}.

The input data Din {d1, d2, d3, . . . , d95, d96} is likened to data arranged in the form of a 8×12 matrix X. The output data Dout {d1, d13, d25, d37, d49, d61, d73, d85, . . . , d60, d72, d84, d96} is likened to data arranged in the form of a 12×8 matrix Y. In this embodiment, rows of the matrix X equal to columns of the matrix Y. Columns of the matrix X equal to rows of the matrix Y. The apparatus for interleave uses a column-by-column/row-by-row interleaving method.

The apparatus for interleave according to the fifth preferred embodiment of the present invention interleaves a parallel data at the same time, causing a data processing against CPU to be quickly executed. The apparatus for interleave according to the fifth preferred embodiment has an advantage in a fast interleaving processing. In addition, the apparatus for interleave according to the fifth preferred embodiment may replace rows with columns in the matrix the number of rows of which differs from the number of columns by L units where L is a positive integer. Therefore, the apparatus for interleave according to the fifth preferred embodiment interleaves a parallel data at the same time, causing a data process against CPU to be quickly executed.

While the preferred form of the present invention has been described, it is to be understood that modifications will be apparent to those skilled in the art without departing from the spirit of the invention.

For example, each of the first switch circuits 110 in FIGS. 1, 3, 5 and 9 may comprise S selectors where S is a positive integer and is no fewer than 5. In this case, the number of the information stored at the same address equals the number of the selectors.

Furthermore, in the apparatus for interleave according to the fifth preferred embodiment, the memory circuit 120 may store the first arranged data based on the first selection signal output from the ROM 152 instead of the address signal ADR1. The memory circuit 120 may output the stored data based on the address signal ADR2 output from the ROM 162 instead of the control signal 160a.

Furthermore, the apparatus for interleave according to the first preferred embodiment comprises two first switch circuits, two memory circuits and two second switch circuits. In other words, the apparatus for interleave has a fist apparatus for interleave and a second apparatus for interleave. In this case, the first apparatus for interleave executes a write-in operation while the second apparatus for interleave executes a read-out operation. Otherwise, the second apparatus for interleave executes the write-in operation which the first apparatus for interleave executes the read-out operation. In this case, the apparatus for interleave may shorten the processing time of the write-in and read-out operations.

The scope of the invention, therefore, is to be determined solely by the following claims.

What is claimed is:

1. An apparatus for interleave comprising:
   a serial-parallel circuit which transforms a data form of an input data from serial into parallel and which outputs a plurality of parallel data;
   a first switch circuit which arranges order of the parallel data based on a first control signal and which outputs a plurality of first arranged data;
   a memory circuit which stores the first arranged data based on the first control signal and which outputs the stored first arranged data based on a second control signal;
   a second switch circuit which arranges order of the stored first arranged data based on the second control signal and which outputs a plurality of second arranged data; and
   a parallel-serial circuit which transforms a data form of the second arranged data from parallel into serial and which outputs a serial output data.

2. The apparatus for interleave according to claim 1, further comprising a control circuit which generates said first control signal based on a write-in clock signal.

3. The apparatus for interleave according to claim 2, wherein said control circuit comprises:
   a counter which counts up based on the write-in clock signal and which outputs an address signal; and
   a memory which stores a plurality of information to arrange order of the parallel data and which outputs the information based on the address signal.

4. The apparatus for interleave according to claim 3, wherein said first control signal comprises said information to be used for arranging order of the parallel data and said address signal to be used for storing the first arranged data.

5. The apparatus for interleave according to claim 4, wherein said memory is a Read Only Memory.

6. The apparatus for interleave according to claim 2, wherein said control circuit is a first control circuit, and wherein the apparatus for interleave further comprises a second control circuit which generates said second control signal based on a read-out clock signal.

7. The apparatus for interleave according to claim 6, wherein said second control circuit comprises:
   a counter which counts up based on the read-out clock signal and which outputs an address signal; and
   a memory which stores a plurality of information to arrange order of the stored first arranged data and which outputs the information based on the address signal.

8. The apparatus for interleave according to claim 7, wherein said memory is a Read Only Memory.

9. The apparatus for interleave according to claim 7, wherein said second control signal comprises said information to be used for arranging order of the stored first arranged data and said address signal to be used for outputting the stored first arranged data.

10. The apparatus for interleave according to claim 9, wherein said memory is a Read Only Memory.

11. The apparatus for interleave according to claim 2, further comprising a control circuit which generates said first and second control signals based on a write-read clock signal.

12. The apparatus for interleave according to claim 11, wherein said control circuit comprises:
   a counter which counts up based on the write-read clock signal and which outputs an address signal; and
   a memory which stores a plurality of information to arrange order of the parallel data and the stored first arranged data and to output the stored first arranged data and which outputs the information based on the address signal.

13. The apparatus for interleave according to claim 12, wherein said control signal comprises said information to be used for arranging order of the parallel data and the stored first arranged data and for outputting the stored first arranged data and said address signal to be used for storing the parallel data.

14. The apparatus for interleave according to claim 2, wherein said control circuit comprises a counter which counts up based on the write-in clock signal and which outputs an address signal as said first control signal.

* * * * *